United States Patent
Lee et al.

(10) Patent No.: US 6,792,376 B2
(45) Date of Patent: Sep. 14, 2004

(54) APPARATUS AND METHOD FOR TESTING SOCKET

(75) Inventors: Ill Young Lee, Suwon-Shi (KR); Dong Myun Byon, Ansan-shi (KR); Tae Won Kang, Suwon-shi (KR); Sei Woong Kim, Gumi-shi (KR)

(73) Assignee: Semibank Co., Ltd, Kyunggi-do (KR)

( * ) Notice: Subject to any disclaimer, the term of this patent is extended or adjusted under 35 U.S.C. 154(b) by 0 days.

(21) Appl. No.: 10/353,217
(22) Filed: Jan. 27, 2003

(65) Prior Publication Data
US 2004/0054491 A1 Mar. 18, 2004

(30) Foreign Application Priority Data
Sep. 17, 2002 (KR) .................. 10-2002-0056633

(51) Int. Cl.[7] ............................................. G01R 31/00
(52) U.S. Cl. ....................................................... 702/117
(58) Field of Search .......................... 702/117; 324/761, 324/727, 403; 701/33, 35, 300; 340/870; 356/326, 315; 320/135; 376/247; 73/28; 439/751; 369/29; 123/198

(56) References Cited

U.S. PATENT DOCUMENTS 4,207,610 A * 6/1980 Gordon ...................... 701/35
4,207,611 A * 6/1980 Gordon ...................... 701/33

* cited by examiner

Primary Examiner—John Barlow
Assistant Examiner—Tung S Lau
(74) Attorney, Agent, or Firm—Roth & Goldman, P.A.

(57) ABSTRACT

An apparatus and a method for testing a socket are disclosed. The resistance values of the contactor pins of the socket can be precisely measured, and the measurement is made automatic so as to decrease the expense and manpower. The method includes the following steps. That is, a calibration PCB is formed into a closed circuit, and all the resistance values forming a closed circuit loop for respective channels are extracted and stored (first step). A socket-installed PCB is formed into a closed circuit, and all resistance values forming a closed circuit loop for respective channels are extracted and stored (second step). Differences between the resistance values of the respective channels of the calibration PCB and the resistance values of the respective channels of the socket-installed PCB are calculated (third step). The differences thus calculated are displayed to a screen for the respective channels (fourth step).

8 Claims, 10 Drawing Sheets

FIG. 8

| | | | |
|---|---|---|---|
| Calibration | | | |
| RANGE 1 | 0.0000 – 0.0800 | 0 | |
| RANGE 2 | 0.0801 – 0.2000 | 34 | |
| RANGE 3 | 0.2001 – 0.3000 | 32 | |
| RANGE 4 | 0.3001 – 0.4000 | 0 | |
| RANGE 5 | 0.4001 – | | |
| Used Time | 0 msec | | |
| Calibration Count | 0 | | |

| Measurement | | | |
|---|---|---|---|
| RANGE 1 | 0.0000 – 0.0800 | 0 | |
| RANGE 2 | 0.0801 – 0.2000 | 0 | |
| RANGE 3 | 0.2001 – 0.3000 | 0 | |
| RANGE 4 | 0.3001 – 0.4000 | 0 | |
| RANGE 5 | 0.4001 – | | |
| Used Time | 0 msec | | |
| Measurement Count | 0 | | |

| Measurement | | | |
|---|---|---|---|
| RANGE 1 | 0.0000 – 0.0800 | 0 | |
| RANGE 2 | 0.0801 – 0.2000 | 34 | |
| RANGE 3 | 0.2001 – 0.3000 | 32 | |
| RANGE 4 | 0.3001 – 0.4000 | 0 | |
| RANGE 5 | 0.4001 – | | |

| # | Value | # | Value |
|---|---|---|---|
| 1 | 0.1889 | 66 | 0.1795 |
| 2 | 0.2594 | 65 | 0.2417 |
| 3 | 0.1792 | 64 | 0.1763 |
| 4 | 0.2461 | 63 | 0.2342 |
| 5 | 0.1786 | 62 | 0.1646 |
| 6 | 0.2491 | 61 | 0.2306 |
| 7 | 0.1797 | 60 | 0.1698 |
| 8 | 0.2484 | 59 | 0.2300 |
| 9 | 0.1841 | 58 | 0.1598 |
| 10 | 0.2308 | 57 | 0.2207 |
| 11 | 0.1690 | 56 | 0.1688 |
| 12 | 0.2399 | 55 | 0.2194 |
| 13 | 0.1763 | 54 | 0.1676 |
| 14 | 0.2413 | 53 | 0.2222 |
| 15 | 0.1650 | 52 | 0.1749 |
| 16 | 0.2307 | 51 | 0.2287 |
| 17 | 0.1577 | 50 | 0.1701 |
| 18 | 0.2208 | 49 | 0.2242 |
| 19 | 0.1701 | 48 | 0.1736 |
| 20 | 0.2370 | 47 | 0.2249 |
| 21 | 0.1631 | 46 | 0.1740 |
| 22 | 0.2320 | 45 | 0.2304 |
| 23 | 0.1644 | 44 | 0.1790 |
| 24 | 0.2330 | 43 | 0.2374 |
| 25 | 0.1626 | 42 | 0.1832 |
| 26 | 0.2255 | 41 | 0.2438 |
| 27 | 0.1630 | 40 | 0.1842 |
| 28 | 0.2334 | 39 | 0.2435 |
| 29 | 0.1687 | 38 | 0.1894 |
| 30 | 0.2445 | 37 | 0.2523 |
| 31 | 0.1716 | 36 | 0.1894 |
| 32 | 0.2290 | 35 | 0.2523 |
| 33 | 0.1762 | 34 | 0.1947 |

APPARATUS AND METHOD FOR TESTING SOCKET

FIELD OF THE INVENTION

The present invention relates to an apparatus and a method for testing a socket. Particularly, the present invention relates to an apparatus and a method for testing a socket, in which the socket for testing the quality of semiconductor devices is tested to decide good or no good quality of it.

BACKGROUND OF THE INVENTION

Generally, a semiconductor device such as a semiconductor chip is installed into s socket to test the good or no good quality of the chip. That is, various characteristics such as temperature, voltage and the like are tested.

In this testing procedure, the semiconductor device can be found to be defective, but in some cases, the semiconductor device is judged to be defective because of a defective socket, and for example, a connector pin and the like of the socket may be defective.

In the case where the socket is defective, in order to find whether the contactor pin is defective, the resistance values of the contactor pins are manually measured one by one. That is, a measuring probe of the resistance measuring apparatus is contacted to the contactor terminals one by one, and if the measured value of the contactor pin is larger than a reference value, then the relevant socket is judged to be defective.

However, since this operation is carried out one by one with hands, very much time and manpower are consumed.

Further, the inherent resistance value of the contactor pin is extremely small, whereas the inherent resistance values of the resistance measuring apparatus and its probe wire are very much larger than the resistance value of the contactor pin, and therefore, a precise measurement is not possible, with the result that the reliability of the judgment on the good or no good quality is very low.

For this reason, if it is judged that the defect does not lie in the semiconductor device, then the expensive socket is wholly discarded, thereby increasing the facility cost burden. This leads to the increase of the measuring expense, resulting in that the price of the semiconductor device rises.

SUMMARY OF THE INVENTION

The present invention is intended to overcome the above described disadvantages of the conventional technique.

Therefore it is an object of the present invention to provide an apparatus and a method for testing a socket, in which the resistance values of the contactor pins of the socket can be precisely measured, and the measurement is made automatic so as to decrease the expense and manpower.

In achieving the above object, the socket testing apparatus according to the present invention includes: a contact unit for obtaining the resistance values of respective channels of a calibration PCB and the resistance values of respective channels of a socket-installed PCB; a multiplexer for channeling the respective resistance values from the contact unit so as to output the resistance values of the respective channels in a sequential manner; a resistance measurement part for storing the respective output resistance values of the multiplexer into a memory, and for calculating differences between the mentioned resistance values and the resistance values of the respective channels of a socket-installed PCB; a controller for controlling the operations of the respective elements, and for outputting the output calculation values of the resistance measurement part to a display part; and the display part displaying the output of the controller.

The contact unit includes: a measurement table with the calibration PCB or the socket-installed PCB mounted thereupon; a contact structure installed thereupon, for contacting to the calibration PCB or to the socket-installed PCB so as to form a closed circuit loop; a first moving means for moving the contact structure up and down, so as to make it contacted to pads of the calibration PCB or to a contactors of the socket; and a second moving means for moving the first moving means horizontally.

BRIEF DESCRIPTION OF THE DRAWINGS

The above object and other advantages of the present invention will become more apparent by describing in detail the preferred embodiment of the present invention with reference to the attached drawings in which:

FIG. 8 illustrates the numerical values of the data of FIG. 7 displayed on the screen.

DETAILED DESCRIPTION OF THE PREFERRED EMBODIMENT

Now the present invention will be described in detail referring to the attached drawings.

Figure 1:
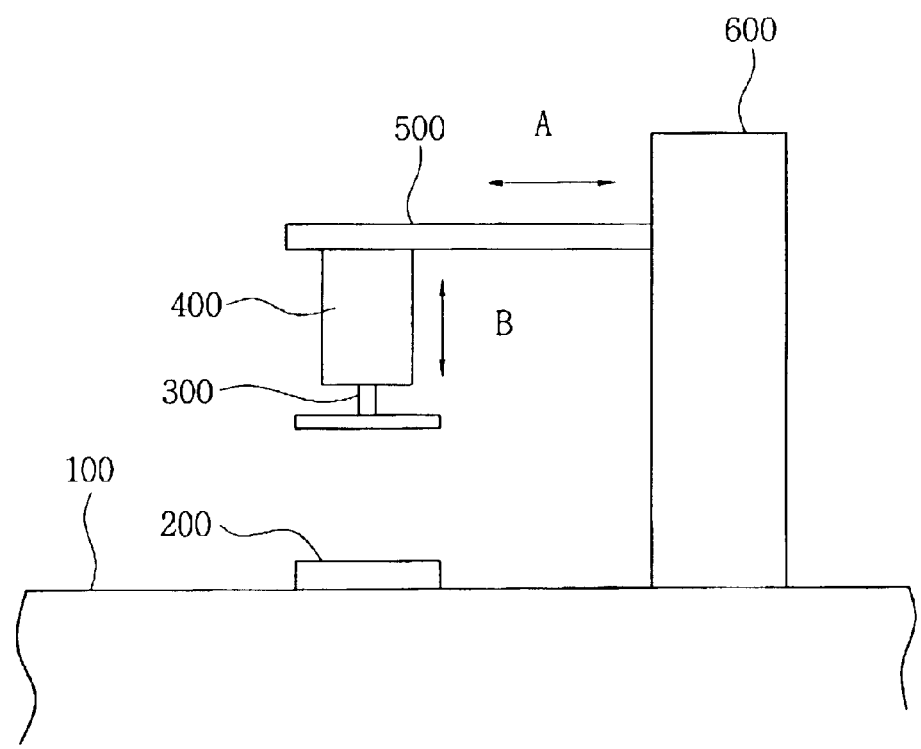
FIG. 1 is a schematic view showing the constitution of the socket testing apparatus according to the present invention.

FIG. 1 is a schematic view showing the constitution of the socket testing apparatus according to the present invention. First, a calibration PCB or a socket-installed PCB is mounted upon a measurement table 100, and then, a contact structure 300 is moved in a direction 'B' by being driven by a cylinder 400, so that the contact structure would be contacted to the PCB 200.

The contact structure 300 is made of a high conductivity material such as beryllium copper, gold, a gold-coated material, silver, a silver-coated material or the like. In the preferred embodiment of the present invention, a copper lump is used.

When the measurement of the resistance value is completed by contacting to the PCB 200, the cylinder 400 is driven to move the contact structure 300 upward in the 'B' direction, and then, another cylinder 600 is driven to move a shaft 500 rightward in the 'A' direction so as to move the cylinder 400 and the contact structure 300 rightward.

Thus the PCB 200 is completely exposed, so that it can be easily replaced with another PCB.

When the PCB 200 is replaced with another PCB upon the table 100, the cylinder 600 is driven to move the shaft 500 leftward in the 'A' direction, with the result that the cylinder 400 and the contact structure 300 are moved upward. At the same time, the cylinder 400 is driven to move the contact structure 300 downward, so that the contact structure 300 is electrically contacted to the PCB 200.

Figure 2:
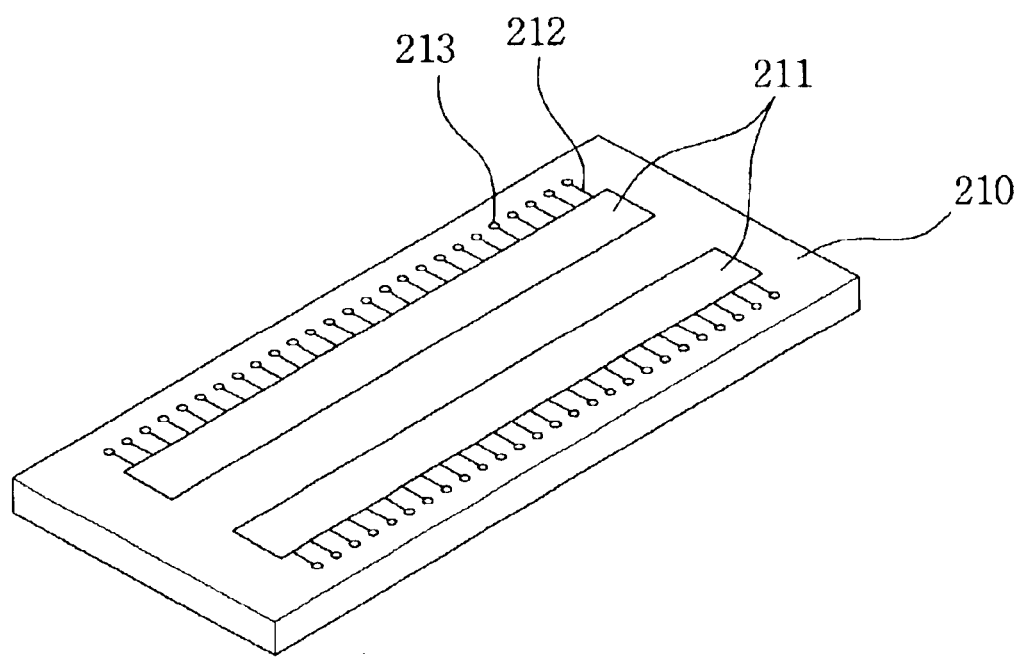
FIG. 2 illustrates the constitution of the calibration PCB.

FIG. 2 illustrates the structure of the calibration PCB. The calibration PCB 210 is integrally provided with a pair of pads 211 to which the both leads of the socket contact.

Further, outwardly from each of the pads, there are formed a plurality of patterns 212 for respective channels, while a terminal block 213 is formed on the end of each of the patterns 212, a probe being to be connected to each of the terminal blocks 213.

Here, the channel has the same conception as the lead terminal block of the socket.

The contact structure 300 consisting of a copper lump is contacted to the terminal blocks 213 in such a manner that each of the terminal blocks 213 forms a closed short circuit.

Figure 3:
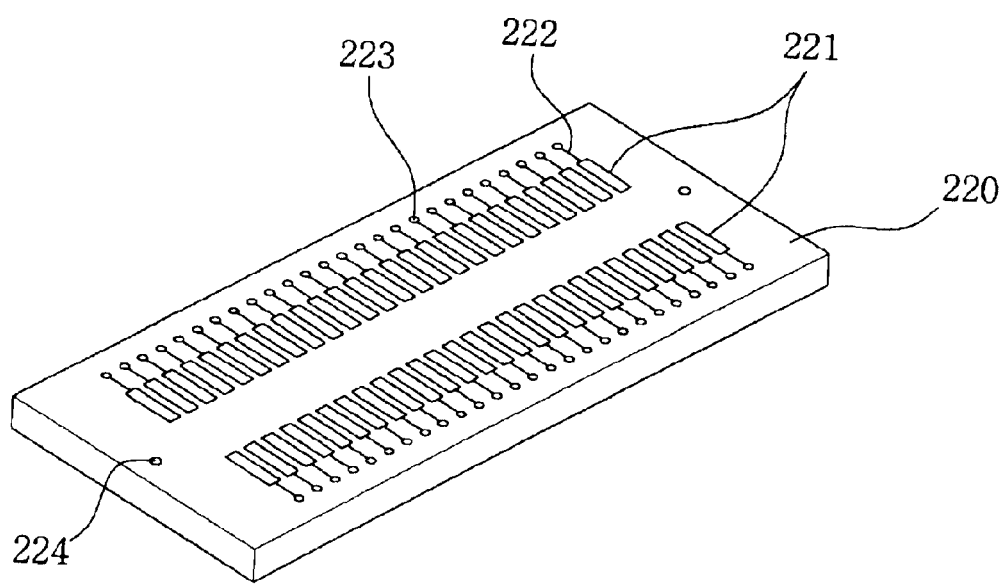
FIG. 3 illustrates the constitution of the PCB used in testing the socket.

FIG. 3 illustrates the constitution of the PCB used in testing the socket. The socket PCB 220 is provided with a plurality of pads 221 in the same number as the number of the lead terminals of the socket, so that the lead terminals of the socket can be contacted to the pads 221 respectively.

Each of the pads 221 is provided with a pattern 222, and a terminal block 223 is formed on the end of each of the patterns 222, the probe being to be contacted to each of the terminal blocks 223.

Further, a pair of guide holes 224 are formed at both ends of the socket PCB 220, so that the lead terminals of the socket can be precisely contacted to the pads 221 respectively.

In the same manner, the contact structure 300 consisting of a copper lump is contacted to the terminal blocks 223 respectively.

Figure 4:
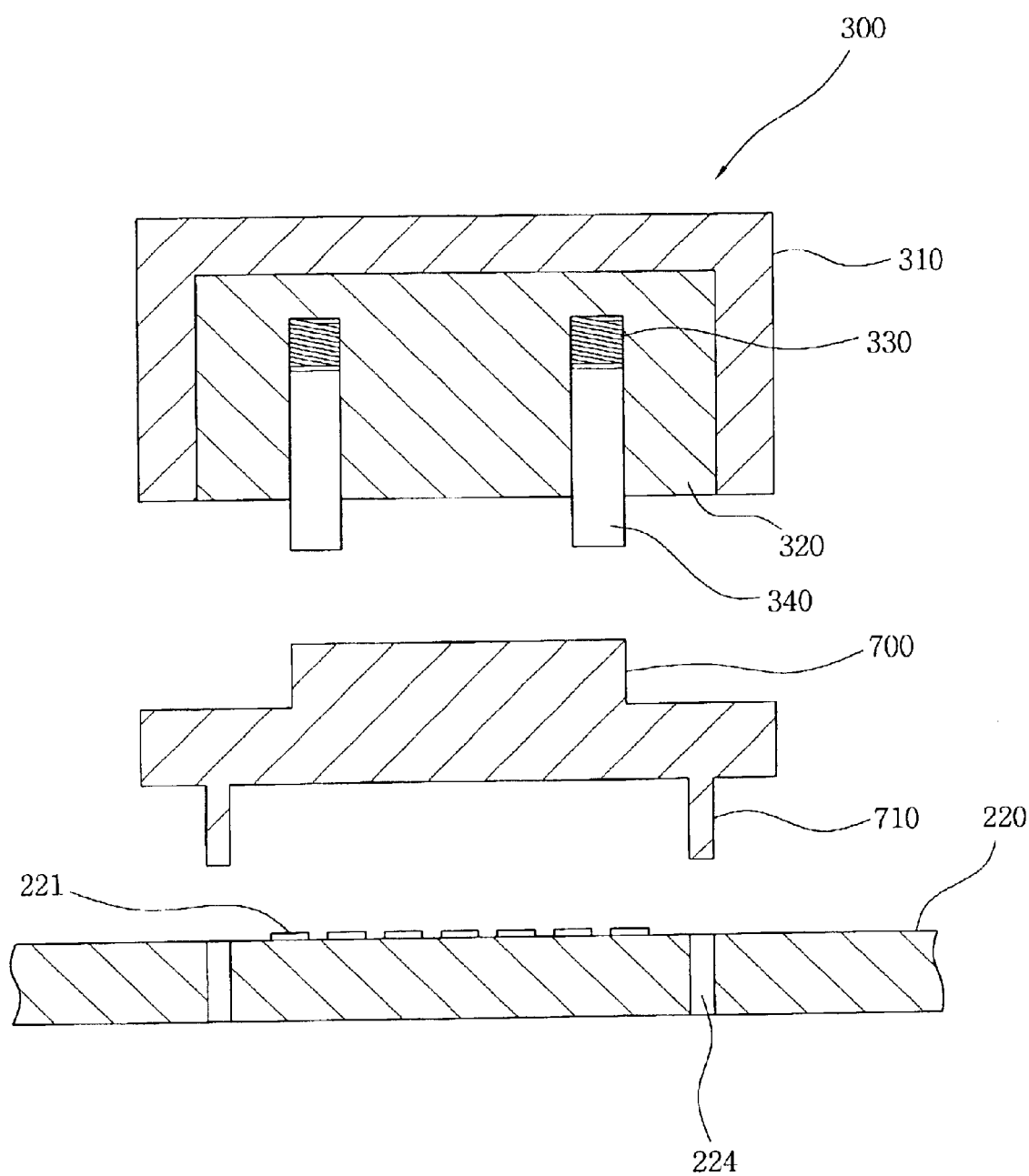
FIG. 4 is a sectional view showing the state when the test is being carried out, with the socket being installed on the PCB.

FIG. 4 is a sectional view showing the state when the test is being carried out, with the socket being installed on the socket PCB 220, and with the contact structure 300 being contacted thereto from above. A pair of guide protuberances 710 of the socket 700 are inserted into the guide holes 224 of the PCB 220, and therefore, respective contact pins (not illustrated) are precisely contacted to the respective pads 221.

The contact structure 300 moves downward from above the socket 700 so as to be contacted to the contact pins of the socket 700. Under this condition, in order to damp the impacts when the contact structure 300 is contacted to the socket 700, there is provided a pusher 340 which is vertically elastic.

The pusher 340 is securely inserted into a pusher housing 320 which is disposed in the lower interior of the contact structure 300, and the top of the pusher 340 is elastically supported with an elastic body 330.

Therefore, when the contact structure 300 moves down to contact the socket 700, the contact structure 300 contacts first to the pusher 340 to damp its impact, and then, contacts to the contactor of the socket 700.

Now the procedure of measuring the resistance vales of the respective contactor pins of the socket 700 will be described.

Figure 5:
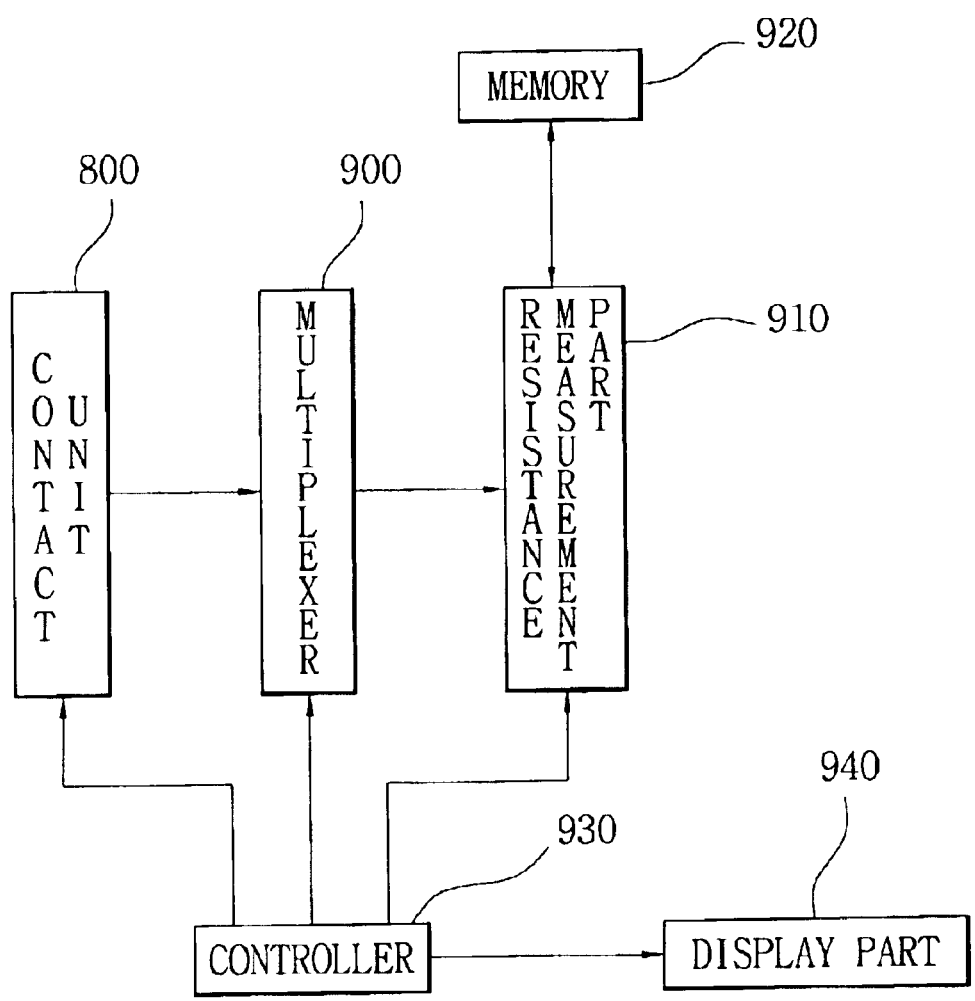
FIG. 5 is a block diagram showing the constitution of the socket testing apparatus according to the present invention.

FIG. 5 is a block diagram showing the constitution of the socket testing apparatus according to the present invention.

As shown in FIG. 1, a contact unit 800 (a comprehensive code 800 is assigned) includes: the measurement table 100, the PCB 200, the contact structure 300, and two cylinders 400 and 600. The resistance values of the calibration PCB 210 of the measurement table 800 are received to a multiplexer 900, and then, a multiplexing i.e., a channeling is carried out.

In the case where there are 66 channels, the multiplexer 900 carries out the multiplexing for the 66 channels in a sequential manner.

Accordingly, the resistance values of the respective channels of the calibration PCB 210 are inputted into the resistance measurement part 910, and then are stored into a memory 920.

Thereafter, if the multiplexed values of the resistance values between the contact unit 800 and the socket PCB 220 are sent to the resistance value measurement part 910 from the multiplexer 900, then the resistance value measurement part 910 calculates the differences between the calibration resistance values of the respective channels (stored in the memory 920) and the resistance values of the respective channels of the socket PCB 220.

That is, the resistance values of the respective contactor pins of the socket are calculated.

This will be described in more details.

If the calibration PCB 210 is mounted upon the measurement table 100, the controller drives the cylinder 400 so as to make the contact structure 300 contacted to the calibration PCB 210.

Figure 6:
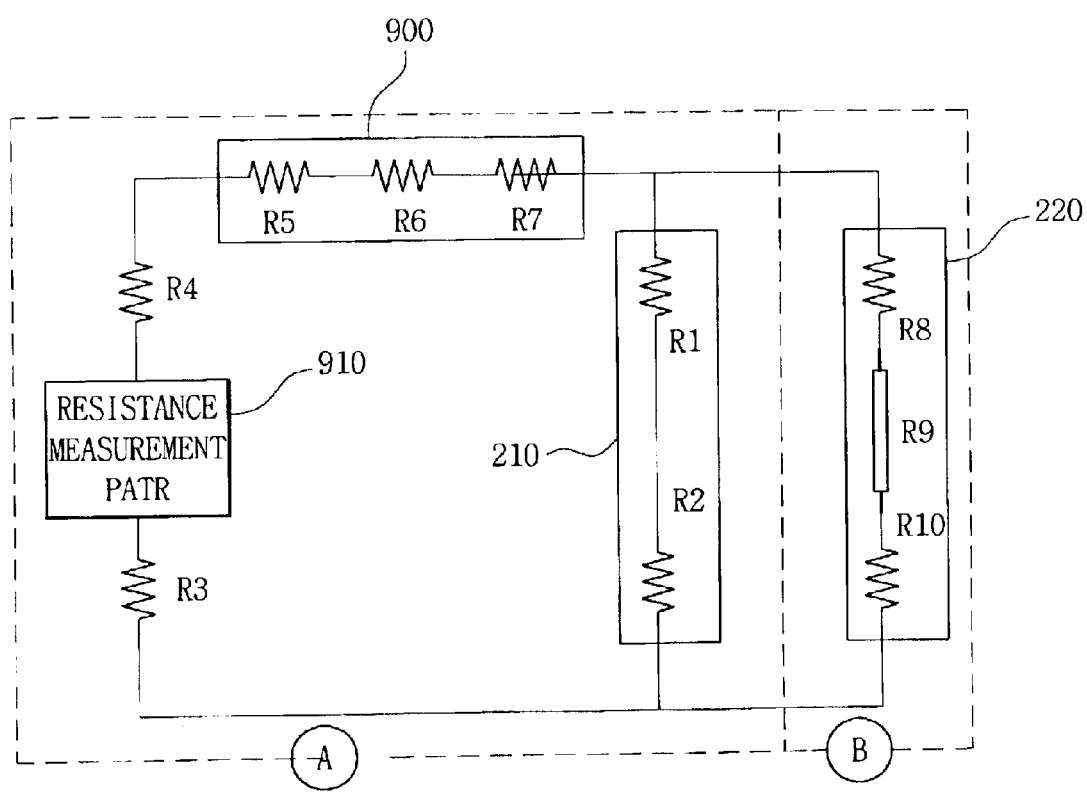
FIG. 6 is a circuit diagram showing the constitution of the socket testing apparatus according to the present invention.

Therefore, as shown in FIG. 6, a closed circuit loop of 'A' is formed, while the socket PCB 220 is excluded from it.

That is, for each of the channels, there are measured: resistances R1 and r2 of the pad 211 and the pattern 212 themselves, resistances R5 and R7 of the circuit itself (PCB pattern) of the multiplexer 900, relay resistance R6 of the multiplexer 900, resistances R3 and R4 of the probe wire forming the closed circuit. These measured resistance values are stored in the memory 920, and at the same time, a controller 930 outputs them to a screen to display them.

Figure 7:
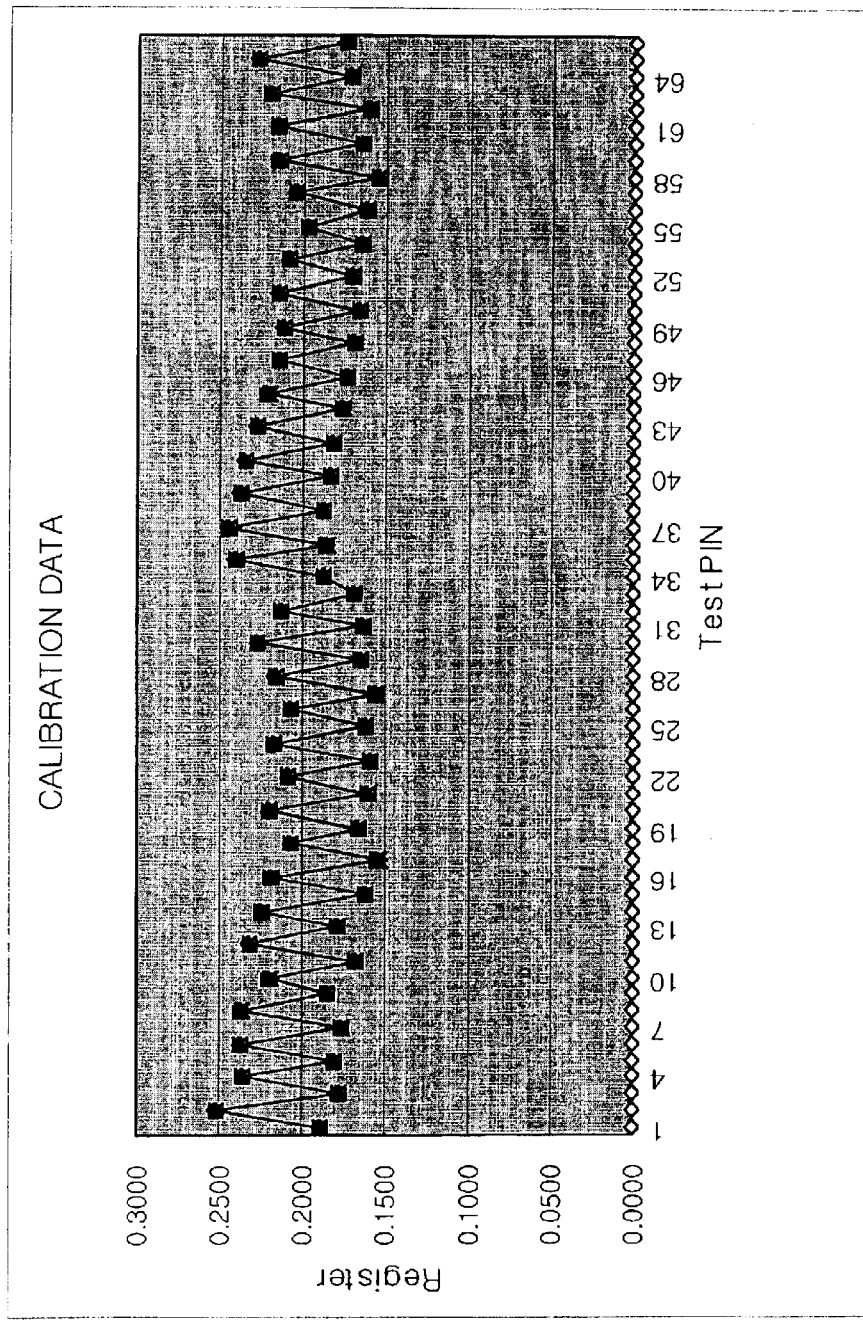
FIG. 7 illustrates the variations of the resistance values in the respective channels when the calibration PCB is used.

Here, the calibration data for the respective channels, i.e., the resistance values are graphically illustrated in FIG. 7. The total 66 calibration channels are measured five times.

Consequently as illustrated, variations of the resistance values in the respective channels are almost not seen, but the resistance values are distributed within a limited range.

That is, although there are differences of resistance values between the respective channels, the resistance value in each of the channels is almost not varied.

This witnesses to the fact that the calibration data of the present invention is highly reliable.

FIG. 8 illustrates the average numerical values of the calibration data displayed on the display part 940, i.e., on the screen. This shows that the resistance values of all the channels are distributed within the calibration data range (RANGE 2 and RANGE 3) of $0.0801\Omega \sim 0.3000\Omega$, which is shown at the right upper portion of the screen.

The resistance values for the 66 channels are listed on the right portion of the screen, and they are the ones that have been stored in the memory 920.

Then if the socket PCB 220 is mounted upon the measurement table 100, the controller 930 also drives the cylinder 400 so as to make the contact structure 300 contacted to the socket PCB 220.

Accordingly, as shown in FIG. 6, a closed circuit loop 'B' is formed, while the calibration PCB 210 is excluded from it.

That is, for each of the channels, there are measured: resistances R8 and R10 of the pad 221 and the pattern 222 themselves, a contactor pin resistance R9, resistances R5 and R7 of the circuit itself (PCB pattern) of the multiplexer 900, relay resistance R6 of the multiplexer 900, and resistances R3 and R4 of the probe wire forming the closed circuit. These measured resistance values are stored in the memory 920.

Under this condition, the resistance measurement part 910 calculates the differences between the resistance values of the respective channels of the calibration PCB 210 (which has been stored in the memory 920) and the resistance values of the respective channels of the socket PCB 220. Then these calculated values are outputted through the display part 940.

These values are the pure resistance values of the contactor pins. That is, the difference between the resistance values of the total system excluding the contactor pins and the resistance values of the total system including the contactor pins are the inherent resistance values of the contactor pins.

Figure 9:
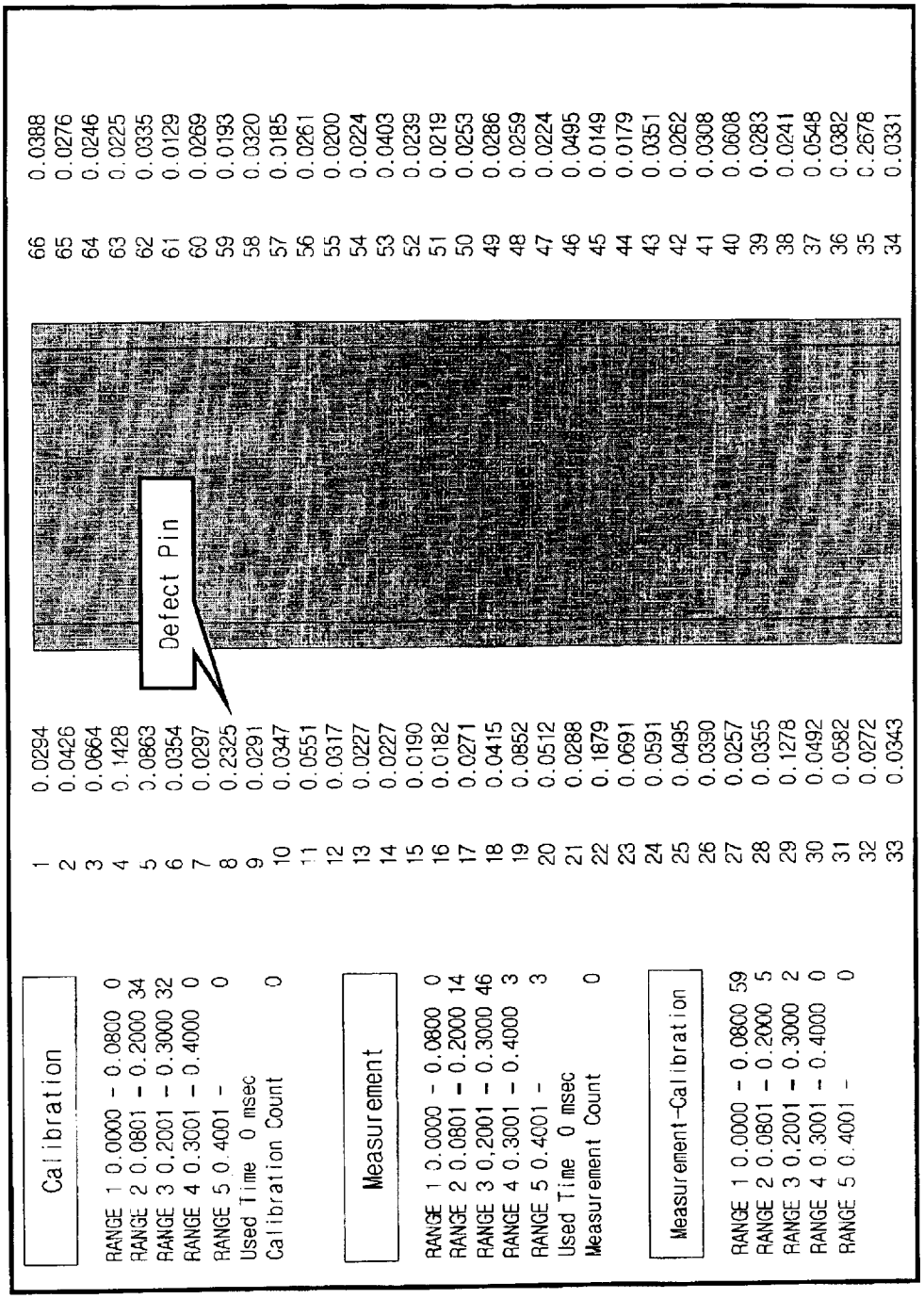
FIGS. 9 and 10 illustrate the variations of the resistance values in the respective channels of the socket-installed PCB.

FIG. 9 illustrates the variations of the resistance values over the respective channels of the socket-installed PCB. On the right side, there are listed the differences of the resistance values between the two sets of the channels.

It is seen that the resistance value of the $8^{th}$ channel is 0.2325Ω, and the resistance value of the $35^{th}$ channel is 0.2678Ω. These values are excessively large compared with the resistance values of other contactor pins, that is, they depart from the upper limit 0.2001Ω, and therefore, it can be known that there are encountered defective contactor pins.

Meanwhile, even if their resistance values do not lie above the upper limit 0.2001Ω, it can be confirmed that there are contactor pins falling into a risky range of 0.0801Ω~0.20000Ω (they are $4^{th}$, $5^{th}$, $22^{nd}$, and $29^{th}$).

Accordingly, the defective pins can be easily confirmed and replaced, and therefore, the expensive socket can be reused. Further, the contactor pins which foretell a defect by falling into the risky range can also be replaced depending on needs, and therefore, the socket can be reused in a reliable manner.

At the left upper portion of the screen of the display part 940, there are seen the frequencies of occurrences of the channels which fall into particular ranges (RANGE 1, RANG2, RANGE 3 and RANG 4) when the calibration PCB 210 is measured. Here, it can be confirmed that they all lie within the range (RANGE 2, RANGE 3) of 0.0801Ω~0.30000Ω.

Further, in the case where the socket PCB 220 is measured, the frequencies of the occurrences of particular resistance values are displayed at the left middle portion of the screen. That is, it can be confirmed that 60 channels are seen within the range (RANGE 2 and RANGE 3) of 0.0801Ω~0.30000Ω, and 6 defective channels are present above the upper limit (RANGE 3, RANGE 4 and RANGE 5) of 0.3001Ω.

Finally, at the left lower portion of the screen, there are sequentially listed the frequencies that the channel occurrence difference values between the two PCBs 210 and 220 occur within a particular range. That is, it can be easily seen that 59 channels existing within the range (RANGE 1) of 0.0000Ω~0.0800Ω are good ones, and 7 defective channels are seen within the range (RANGE 2, RANGE 3 and RANGE 4) of 0.0801Ω and over.

Figure 10:
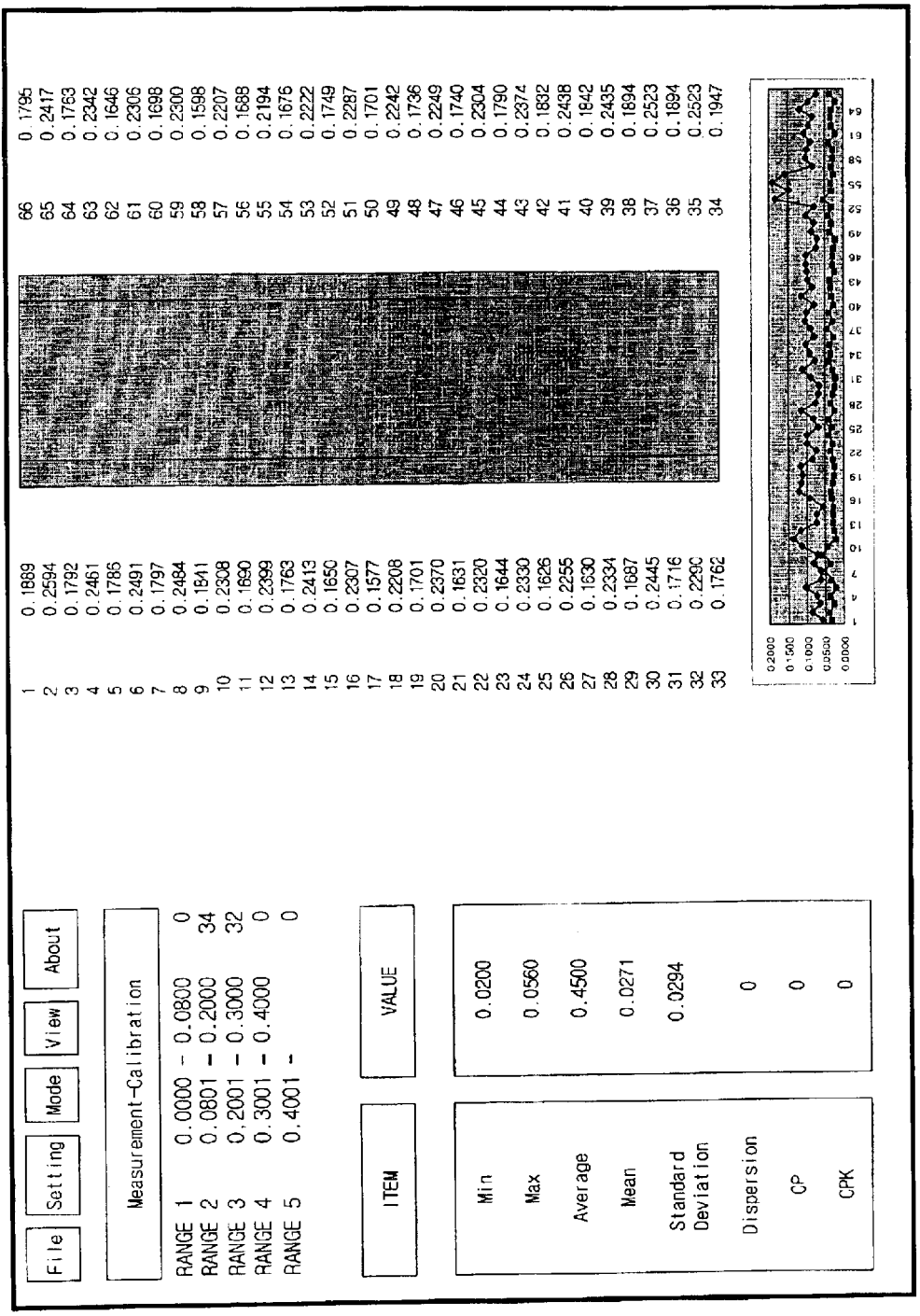

FIG. 10 illustrates the variations of the resistance values in the respective channels of the socket-installed PCB in another embodiment. At the right upper portion of the screen, there are displayed the differences between the resistance values of the respective channels.

That is, there are listed the numerical resistance values of the first channel to the $66^{th}$ channel, while the magnitudes of the resistance values of the respective channels are graphically visually displayed at the right lower portion of the screen. Therefore, it can be easily confirmed that if any of them are outstandingly large or outstandingly small, then they can be easily recognized.

At the left upper portion of the screen, there are sequentially listed the frequencies that the channel occurrence difference values occur within a particular resistance value range. Meanwhile, at the left lower portion of the screen, there is a statistical window in which the respective values for the items (such as Min, Max, Average, Mean, Median, . . . ) are displayed.

According to the present invention as described above, the resistance values of the respective contactors of the socket are precisely measured. Therefore, the work efficiency is improved, and the maintenance of the socket becomes easy, with the result that the facility operation rate and the productivity are improved. Further, only the defective contactors have only to be replaced, and therefore, the expensive socket can be reused, thereby saving the operation cost.

Further, the present invention not only can be applied to the socket and PCB, but also can be applied widely to other fields requiring a precise measurement.

What is claimed is:

1. The socket testing apparatus comprising:

a contact unit for obtaining resistance values of respective channels of a calibration PCB and resistance values of respective channels of a socket-installed PCB;

a multiplexer for channeling the respective resistance values from the contact unit so as to output the resistance values of the respective channels in a sequential manner;

a resistance measurement part for storing the respective output resistance values of the multiplexer into a memory, and for calculating differences between the mentioned resistance values and the resistance values of the respective channels of a socket-installed PCB;

a controller for controlling operations of respective elements, and for outputting the output calculation value of the resistance measurement part to a display part; and the display part displaying an output of the controller wherein the contact unit comprises:

a measurement table with the calibration PCB or the socket-installed PCB mounted thereupon;

a contact structure installed thereupon, for contacting to the calibration PCB or to the socket-installed PCB so as to form a closed circuit loop; and a first moving means for moving the contact structure up and down, so as to make it contacted to pads of the calibration PCB or to contactors of the socket.

2. The socket testing apparatus as claimed in claim 1, further comprising: a second moving means for moving the first moving means horizontally.

3. The socket testing apparatus as claimed in claim 1, wherein the contact structure is made of a high conductivity material, and in its bottom interior, there is disposed a pusher having an elastic property for damping an impact when contacting to the socket.

4. The socket testing apparatus as claimed in claim 1, wherein in the calibration PCB, a plurality of pads for respective channels are merged into a single pad.

5. The socket testing apparatus as claimed in claim 1, wherein the resistance values of the calibration PCB are all the resistance values that form a closed circuit loop, with the resistance values of the socket-installed PCB being excluded.

6. The socket testing apparatus as claimed in claim 1, wherein the resistance values of the socket-installed PCB are all the resistance values that form a closed circuit loop, with the resistance values of the calibration PCB being excluded.

7. A socket testing method comprising the steps of:

forming a calibration PCB into a closed circuit, and extracting and storing all resistance values forming a closed circuit loop for respective channels (first step);

forming a socket-installed PCB into a closed circuit, and extracting and storing all resistance values forming a closed circuit loop for respective channels (second step);

calculating differences between the resistance values of the respective channels of the calibration PCB and the resistance values of the respective channels of the socket-installed PCB (third step); and displaying the differences thus calculated to a screen for the respective channels (fourth step), wherein the screen of the fourth step displays: frequencies of occurrences of channels within a particular resistance value range when the calibration PCB is measured, frequencies of occurrences of channels within a particular resistance value range when the socket-installed PCB is measured, and frequencies of occurrences of differences between the channels of the two PCBs, in a sequential manner at a left portion of the screen; and differences of resistance values of the respective channels between the calibration PCB and the socket-installed PCB at a right portion of the screen.

8. A socket testing method comprising the steps of:

forming a calibration PCB into a closed circuit, and extracting and storing all resistance values forming a closed circuit loop for respective channels (first step);

forming a socket-installed PCB into a closed circuit, and extracting and storing all resistance values forming a closed circuit loop for respective channels (second step);

calculating differences between the resistance values of the respective channels of the calibration PCB and the resistance values of the respective channels of the socket-installed PCB (third step); and displaying the differences thus calculated to a screen for the respective channels (fourth step) wherein the screen of the fourth step displays:

frequencies of occurrence differences between the channels of the calibration PCB and the socket-installed PCB within a particular resistance value range at a left upper portion of the screen;

a statistical window for measured data at a left lower portion of the screen;

numerical resistance values of the respective channels at a right upper portion of the screen; and magnitudes of resistance values of the respective channels graphically and visually at a right lower portion of the screen.

* * * * *